(12) United States Patent
Xiao et al.

(10) Patent No.: US 11,557,473 B2
(45) Date of Patent: Jan. 17, 2023

(54) SYSTEM AND METHOD TO CONTROL PVD DEPOSITION UNIFORMITY

(71) Applicant: Applied Materials, Inc., Santa Clara, CA (US)

(72) Inventors: Wen Xiao, Singapore (SG); Vibhu Jindal, San Jose, CA (US); Sanjay Bhat, Bangalore (IN)

(73) Assignee: Applied Materials, Inc., Santa Clara, CA (US)

( * ) Notice: Subject to any disclaimer, the term of this patent is extended or adjusted under 35 U.S.C. 154(b) by 175 days.

(21) Appl. No.: 16/850,670

(22) Filed: Apr. 16, 2020

(65) Prior Publication Data

US 2020/0335331 A1 Oct. 22, 2020

Related U.S. Application Data

(60) Provisional application No. 62/895,227, filed on Sep. 3, 2019, provisional application No. 62/836,133, filed on Apr. 19, 2019.

(51) Int. Cl.
*H01L 21/02* (2006.01)
*H01L 21/68* (2006.01)
*H01L 21/687* (2006.01)

(52) U.S. Cl.
CPC ...... *H01L 21/02266* (2013.01); *H01L 21/681* (2013.01); *H01L 21/68764* (2013.01)

(58) Field of Classification Search
CPC ............. H01L 21/02266; H01L 21/681; H01L 21/68764; H01L 21/68792; C23C 14/225; C23C 14/3407; C23C 14/352; C23C 14/505; C23C 14/542; C23C 14/564;
(Continued)

(56) References Cited

U.S. PATENT DOCUMENTS 5,820,682 A 10/1998 Sung et al.
5,958,605 A 9/1999 Montcalm et al.
6,998,033 B2 2/2006 Lawson et al.
(Continued)

FOREIGN PATENT DOCUMENTS

EP 2586889 A1 5/2013
JP H01309967 A 12/1989
(Continued)

OTHER PUBLICATIONS

Gullikson, E.M., et al., "Recent Developments in EUV Reflectometry at the Advanced Light Source", pp. 1-11.
(Continued)

*Primary Examiner* — Mohammed Shamsuzzaman
(74) *Attorney, Agent, or Firm* — Servilla Whitney LLC

(57) ABSTRACT

A physical vapor deposition chamber comprising a tilting substrate support is described. Methods of processing a substrate are also provided comprising tilting at least one of the substrate and the target to improve the uniformity of the layer on the substrate from the center of the substrate to the edge of the substrate. Process controllers are also described which comprise one or more process configurations causing the physical deposition chamber to perform the operations of rotating a substrate support within the physical deposition chamber and tilting the substrate support at a plurality of angles with respect to a horizontal axis.

10 Claims, 12 Drawing Sheets

(58) Field of Classification Search
CPC ....... G03F 1/52; H01J 37/3408; H01J 37/342; H01J 37/347; H01J 37/3476
See application file for complete search history.

(56) References Cited

U.S. PATENT DOCUMENTS

| | | | |
|---|---|---|---|
| 7,824,270 B2 | 11/2010 | Smith | |
| 8,906,208 B2* | 12/2014 | Kitada | H01J 37/3452 204/298.18 |
| 9,217,201 B2 | 12/2015 | Rogers et al. | |
| 9,322,094 B2* | 4/2016 | Kajihara | H01J 37/3447 |
| 9,543,125 B2* | 1/2017 | Lin | H01J 37/32669 |
| 9,991,102 B2* | 6/2018 | Tsunekawa | C23C 14/3464 |
| 10,086,492 B2 | 10/2018 | David et al. | |
| 10,199,230 B2 | 2/2019 | Ganguli et al. | |
| 10,236,225 B2 | 3/2019 | Suzuki et al. | |
| 11,021,783 B2* | 6/2021 | Saisho | C23C 14/352 |
| 2004/0222101 A1* | 11/2004 | Ajmera | C25D 21/06 205/101 |
| 2008/0116067 A1* | 5/2008 | Lavitsky | H01J 37/3408 204/298.12 |
| 2009/0276097 A1* | 11/2009 | Patalay | H01L 21/68 118/712 |
| 2010/0133090 A1 | 6/2010 | Endo et al. | |
| 2011/0223346 A1* | 9/2011 | Kitada | H01J 37/3266 427/523 |
| 2013/0092528 A1 | 4/2013 | Fujii et al. | |
| 2013/0161182 A1 | 6/2013 | Nagamine et al. | |
| 2014/0264363 A1 | 9/2014 | Zhu et al. | |
| 2014/0272684 A1 | 9/2014 | Hofmann et al. | |
| 2015/0176117 A1* | 6/2015 | Fong | C23C 14/5833 204/298.04 |
| 2017/0154804 A1* | 6/2017 | Angelov | H01L 21/68764 |

FOREIGN PATENT DOCUMENTS

| | | | |
|---|---|---|---|
| JP | H10121237 A | 5/1998 | |
| JP | 2001240965 A | 9/2001 | |
| JP | 2004232006 A | 8/2004 | |
| WO | WO-2017184293 A1 * | 10/2017 | ....... C23C 16/45565 |

OTHER PUBLICATIONS

PCT International Search Report and Written Opinion in PCT/US2020/028665 dated Aug. 4, 2020, 14 pages.
PCT International Search Report and Written Opinion in PCT/US2020/028668 dated Jul. 29, 2020, 12 pages.
Machine Translation of JPH01309967, 4 pages.

* cited by examiner

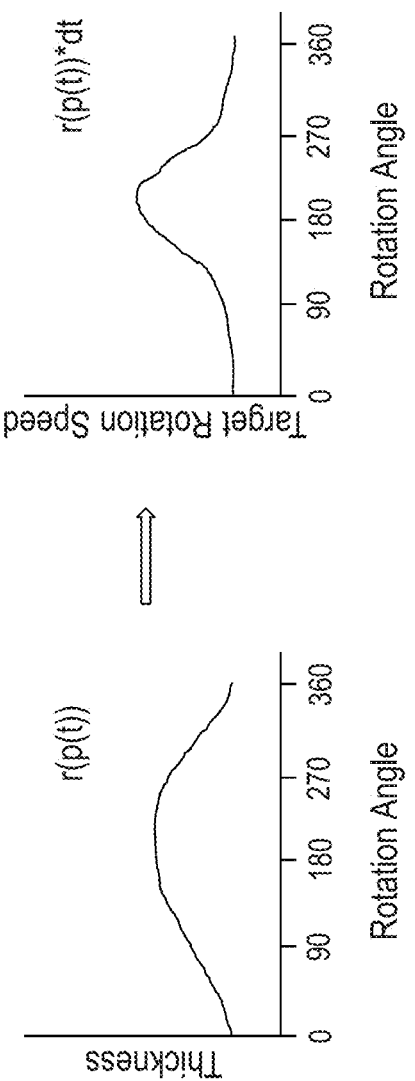
FIG. 4A
FIG. 4B
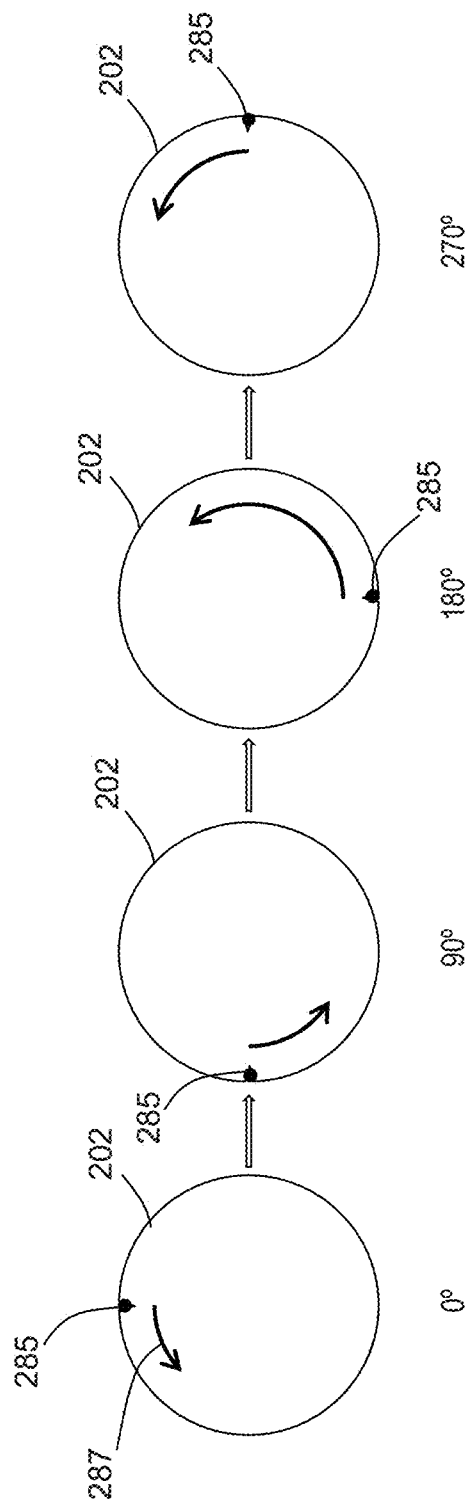
FIG. 5

SYSTEM AND METHOD TO CONTROL PVD DEPOSITION UNIFORMITY

CROSS-REFERENCE TO RELATED APPLICATIONS

This application claims priority to U.S. Provisional Application No. 62/895,227, filed Sep. 3, 2019, and U.S. Provisional Application No. 62/836,133, filed Apr. 19, 2019, the entire disclosures of which are hereby incorporated by reference herein.

TECHNICAL FIELD

The present disclosure relates generally physical vapor deposition chambers, and more particularly, to control of deposition uniformity in physical vapor deposition chambers.

BACKGROUND

The thickness tolerances on many optical multilayer coating stacks can be very demanding and require precise deposition control and monitoring. In addition to the common problems associated with process control and layer thickness monitoring, particularly for coatings with small error tolerances, large substrates add another difficulty in that the nonuniformity of coating thickness may exceed the error tolerance of the design.

An example of multilayer coating stacks that require a high degree of uniformity is extreme ultraviolet elements. Extreme ultraviolet (EUV) lithography, also known as soft x-ray projection lithography, can be used for the manufacture of 0.0135 micron and smaller minimum feature size semiconductor devices. However, extreme ultraviolet light, which is generally in the 5 to 100 nanometer wavelength range, is strongly absorbed in virtually all materials. For that reason, extreme ultraviolet systems work by reflection rather than by transmission of light. Through the use of a series of mirrors, or lens elements, and a reflective element, or mask blank, coated with a non-reflective absorber mask pattern, the patterned actinic light is reflected onto a resist-coated semiconductor substrate. An EUV reflective element operates on the principle of a distributed Bragg reflector. A substrate supports a multilayer (ML) mirror of 20-80 pairs of alternating layers of two materials, for example, molybdenum and silicon.

The materials that form multilayer stacks of optical coatings such as EUV mask blanks are typically deposited in a physical deposition (PVD) chamber onto a substrate such a low thermal expansion substrate or silicon substrate. Thin film uniformity across a wafer/substrate is one of the most fundamental requirements for PVD system. There remains a need to improve uniformity of deposition of layers of material onto substrates in PVD chambers.

SUMMARY

In a first aspect of the disclosure a substrate processing method comprises supporting a substrate having an exposed substrate surface in a physical vapor deposition process chamber on a substrate support; producing a plume of deposition material from a target, the plume of deposition material producing a plume area with respect to the substrate surface; depositing a layer from the plume of deposition material on the exposed substrate surface; determining uniformity of the layer on the substrate across the substrate from a center of the substrate to an edge of the substrate; and tilting at least one of the substrate and the target to improve the uniformity of the layer on the substrate from the center of the substrate to the edge of the substrate.

In a second aspect a physical vapor deposition chamber comprises a first target comprising material to be deposited on a substrate; a motor coupled to a rotational shaft having a rotational axis; and a substrate support coupled to the rotational shaft by a coupling comprising a pivot, the coupling configured to move the substrate support from a position that is parallel to a horizontal axis and tilted at an angle from the horizontal axis.

In a third aspect, a non-transitory computer-readable storage medium including instructions, that, when executed by a processing unit of physical deposition chamber, causes the physical deposition chamber to perform the operations of rotating a substrate support within the physical deposition chamber; tilting the substrate support at a plurality of angles with respect to a horizontal axis; and applying power to cathode within the physical vapor deposition chamber to generate a plasma within the processing system to form a first layer of material on the substrate.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 4A and 4B are graphs illustrating a method according to an embodiment of the disclosure;

FIG. 5 is an illustration of a method according to an embodiment of the disclosure;

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

Those skilled in the art will understand that the use of ordinals such as "first" and "second" to describe process regions do not imply a specific location within the processing chamber, or order of exposure within the processing chamber.

The term "horizontal" as used herein is defined as a plane parallel to the plane or surface of a mask blank, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" indicates that there is direct contact between elements. The term "directly on" indicates that there is direct contact between elements with no intervening elements.

EUV reflective elements such as lens elements and EUV mask blanks must have high reflectivity towards EUV light. The lens elements and mask blanks of extreme ultraviolet lithography systems are coated with the reflective multilayer coatings of materials (e.g., molybdenum and silicon). Reflection values of approximately 65% per lens element, or mask blank, have been obtained by using substrates that are coated with multilayer coatings that strongly reflect light within an extremely narrow ultraviolet bandpass, for example, 12.5 to 14.5 nanometer bandpass for 13.5 nanometer EUV light.

Figure 1:
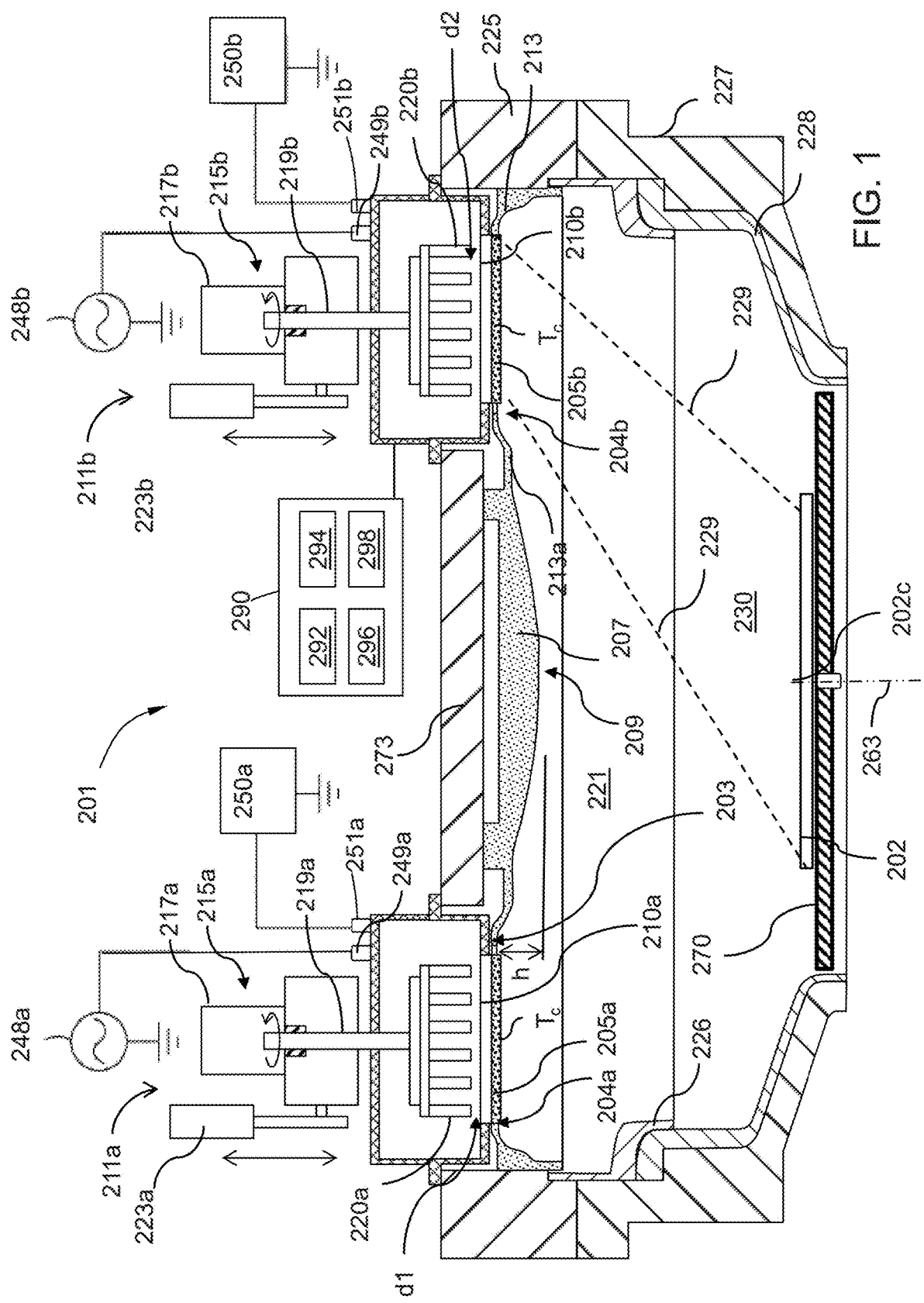
FIG. 1 is a side view of a physical vapor deposition (PVD) chamber according to one or more embodiments.

FIG. 1 depicts an example of a PVD chamber 201 in accordance with a first embodiment of the disclosure. PVD chamber 201 includes a plurality of cathode assemblies 211a and 211b. While only two cathode assemblies 211a and 211b are shown in the side view of FIG. 1, a multi-cathode chamber can comprise more than two cathode assemblies, for example, five, six or more than six cathode assemblies arranged around a top lid of the chamber 201. An upper shield 213 is provided below the plurality of cathode assemblies 211a and 211b, the upper shield 213 having two shield holes 204a and 204b to expose targets 205a, 205b disposed at the bottom of the cathode assemblies 211a and 211b to the interior space 221 of the PVD chamber 201. A middle shield 226 is provided below and adjacent upper shield 213, and a lower shield 228 is provided below and adjacent upper shield 213. In the embodiment shown, there is an upper shield 213, a middle shield 226 and a lower shield 228. However, the present disclosure is not limited to this configuration. The middle shield 226 and the lower shield 228 can be combined into a single shield unit according to one or more embodiments.

A modular chamber body is disclosed in FIG. 1, in which an intermediate chamber body 225 is located above and adjacent a lower chamber body 227. The intermediate chamber body 225 is secured to the lower chamber body 227 to form the modular chamber body, which surrounds lower shield 228 and the middle shield. A top adapter lid 273 is disposed above intermediate chamber body 225 to surround upper shield 213. However, it will be understood that the present disclosure is not limited to a PVD chamber 201 having the modular chamber body as shown in FIG. 1

PVD chamber 201 is also provided with a rotating substrate support 270, which can be a rotating substrate support to support the substrate 202. The rotating substrate support 270 can also be heated by a resistance heating system. The PVD chamber 201, which comprises a plurality of cathode assemblies including a first cathode assembly 211a including a first backing plate 291a, is configured to support a first target 205a during a sputtering process and a second cathode assembly 211b including a second backing plate 291b configured to support a second target 205b during a physical vapor deposition or sputtering process.

The PVD chamber 201 further comprises an upper shield 213 below the plurality of cathode assemblies 211a, 211b having a first shield hole 204a having a diameter D1 and positioned on the upper shield to expose the first cathode assembly 211a and a second shield hole 204b having a diameter D2 and positioned on the upper shield 213 to expose the second cathode assembly 211b, the upper shield 213 having a substantially flat inside surface 203, except for a region 207 between the first shield hole 204a and the second shield hole 204b.

The upper shield 213 includes a raised area 209 in the region 207 between the first shield hole and the second shield hole, the raised area 209 having a height "H" from the substantially flat inside surface 203 that greater than one centimeter from the flat inside surface 203 and having a length "L" greater than the diameter D1 of the first shield hole 204a and the diameter D2 of the second shield hole 204b, wherein the PVD chamber is configured to alternately sputter material from the first target 205a and the second target 205b without rotating the upper shield 213.

In one or more embodiments, the raised area 209 has a height h so that during a sputtering process, the raised area height h is sufficient to prevents material sputtered from the first target 205a from being deposited on the second target 205b and to prevent material sputtered from the second target 205b from being deposited on the first target 205a.

According to one or more embodiments of the disclosure, the first cathode assembly 211a comprises a first magnet spaced apart from the first backing plate 291a at a first distance d1 and the second cathode assembly 211b comprises a second magnet 220b spaced apart from the second backing plate 291b at a second distance d2, wherein the first magnet 220a and the second magnet 220b are movable such that the first distance d1 can be varied and the second distance d2 can be varied. The distance d1 and the distance d2 can be varied by linear actuator 223a to change the distance d1 and linear actuator 223b to change the distance d2. The linear actuator 223a and the linear actuator 223b can comprise any suitable device that can respectively affect linear motion of first magnet assembly 215a and second magnet assembly 215b. First magnet assembly 215a includes rotational motor 217a, which can comprise a servo motor to rotate the first magnet 220a via shaft 219a coupled to rotational motor 217a. Second magnet assembly 215b includes rotational motor 217b, which can comprise a servo motor to rotate the second magnet 220b via shaft 219b coupled to rotational motor 217b. It will be appreciated that the first magnet assembly 215a may include a plurality of magnets in addition to the first magnet 220a. Similarly, the second magnet assembly 215b may include a plurality of magnets in addition to the second magnet 220b.

In one or more embodiments, wherein the first magnet 220a and second magnet 220b are configured to be moved to decrease the first distance d1 and the second distance d2 to increase magnetic field strength produced by the first magnet 220a and the second magnet 220b and to increase the first distance d1 and the second distance d2 to decrease magnetic field strength produced by the first magnet 220a and the second magnet 220b.

In some embodiments, the first target 205a comprises a molybdenum target and the second target 205b comprises a silicon target, and the PVD chamber 201 further comprises a third cathode assembly (not shown) including a third backing plate to support a third target 205c and a fourth cathode assembly (not shown) including a fourth backing plate configured to support a fourth target 205d. The third cathode assembly and fourth cathode assembly according to one or more embodiments are configured in the same manner as the first and second cathode assemblies 211a, 211b as described herein. In some embodiments, the third target 205c comprises a dummy target and the fourth target 205d comprises a dummy target. As used herein, "dummy target" refers to a target that is not intended to be sputtered in the PVD apparatus 201.

Plasma sputtering may be accomplished using either DC sputtering or RF sputtering in the PVD chamber 201. In some embodiments, the process chamber includes a feed structure for coupling RF and DC energy to the targets associated with each cathode assembly. For cathode assembly 211a, a first end of the feed structure can be coupled to an RF power source 248a and a DC power source 250a, which can be respectively utilized to provide RF and DC energy to the first target 205a. The RF power source 248a is coupled to RF power in 249a and the DC power source 250a is coupled to DC power in 251a. For example, the DC power source 250a may be utilized to apply a negative voltage, or bias, to the target 305a. In some embodiments, RF energy supplied by the RF power source 248a may range in frequency from about 2 MHz to about 60 MHz, or, for example, non-limiting frequencies such as 2 MHz, 13.56 MHz, 27.12 MHz, 40.68 MHz or 60 MHz can be used. In some embodiments, a plurality of RF power sources may be provided (i.e., two or more) to provide RF energy in a plurality of the above frequencies.

Likewise, for cathode assembly 211b, a first end of the feed structure can be coupled to an RF power source 248b and a DC power source 250b, which can be respectively utilized to provide RF and DC energy to the second target 205b. The RF power source 248b is coupled to RF power in 249a and the DC power source 250b is coupled to DC power in 251b. For example, the DC power source 250b may be utilized to apply a negative voltage, or bias, to the second target 205b. In some embodiments, RF energy supplied by the RF power source 248b may range in frequency from about 2 MHz to about 60 MHz, or, for example, non-limiting frequencies such as 2 MHz, 13.56 MHz, 27.12 MHz, 40.68 MHz or 60 MHz can be used. In some embodiments, a plurality of RF power sources may be provided (i.e., two or more) to provide RF energy in a plurality of the above frequencies.

While the embodiment shown includes separate RF power sources 248a and 248b for cathode assemblies 211a and 211b, and separate DC power sources 250a and 250b for cathode assemblies 211a and 211b, the PVD chamber can comprise a single RF power source and a single DC power source with feeds to each of the cathode assemblies.

In some embodiments, the methods described herein are conducted in the PVD chamber 201 equipped with a controller 290. There may be a single controller or multiple controllers. When there is more than one controller, each of the controllers is in communication with each of the other controllers to control of the overall functions of the PVD chamber 201. For example, when multiple controllers are utilized, a primary control processor is coupled to and in communication with each of the other controllers to control the system. The controller is one of any form of general-purpose computer processor, microcontroller, microprocessor, etc., that can be used in an industrial setting for controlling various chambers and sub-processors. As used herein, "in communication" means that the controller can send and receive signals via a hard-wired communication line or wirelessly.

Each controller 290 can comprise a processor 292, a memory 294 coupled to the processor 292, input/output devices coupled to the processor 292, and support circuits 296 and 298 to provide communication between the different electronic components of a chamber of the type shown in FIG. 1. The memory 294 includes one or more of transitory memory (e.g., random access memory) and non-transitory memory (e.g., storage) and the memory of the processor may be one or more of readily available memory such as random access memory (RAM), read-only memory (ROM), floppy disk, hard disk, or any other form of digital storage, local or remote. The memory can retain an instruction set that is operable by the processor to control parameters and components of the system. The support circuits are coupled to the processor for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor that is remotely located from the hardware being controlled by the processor. In one or more embodiments, some or all of the methods of the present disclosure are controlled hardware. As such, in some embodiments, the processes are implemented by software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller has one or more configurations to execute individual processes or sub-processes to perform the method. In some embodiments, the controller is connected to and configured to operate intermediate components to perform the functions of the methods.

Multi-cathode (MC) PVD chambers of the type shown in FIG. 1 are designed deposition of multiple layers and multilayer stacks in a single chamber or co-sputtering of alloys/compound, which are ideal for applications such as optical filters and parts of EUV reflective elements including reflective multilayer stacks and absorber layers.

To fit multiple targets in a multi-cathode PVD chamber, each target 205a, 205b has a diameter that is smaller than the substrate 202 on the substrate support 270. This in the substrate radial center 202c being offset at an angle from radial center $T_c$ of target 205b. In any PVD process, source material starts from a condensed phase (the target) and then transports though a vacuum or low pressure gaseous environment in the form of vapor (a plasma) within a PVD chamber. The vapor then condenses on a substrate to produce a thin film coating. Atoms from the source material (target) are ejected by momentum transfer from a bombarding particle, typically a gaseous ion. During physical vapor deposition, a plume of deposition material is produced, which results in a deposition profile which is uneven, but symmetrically centered about the axis of the sputtering target. In general, the net deposition plume in the region of the substrate is highly non-uniform.

In FIG. 1, a deposition plume can be envisioned by the dashed lines 229 extending from the target 205b to the substrate 202. The plume area 230 is bounded by dashed lines 229, the target 205b and the substrate 202 encompasses a plume area 230 during a PVD process.

In FIG. 1, the plume area 230 is roughly represented by the dashed lines 229. During a PVD process, the plume area 230 may have a non-uniform shape, such as the shape shown in FIG. 2. It will be appreciated that the shape of the plume area 230 is only roughly approximated as shown in Figures. As will be appreciated however, the plume of deposition material that is deposited on the substrate 202 will often be non-uniform, which will result in non-uniform deposition on a substrate. Thus, the representations provided in the Figures of instant disclosure are not intended to be limiting of the shape of the plume of deposition material formed during a PVD process. It will be appreciated that the shape of the plume in contact with the substrate 202 is non-uniform, which results in non-uniform deposition.

In the manufacture of EUV reflective elements, because of the nature of the multilayer stack and the small feature size, any imperfections in the uniformity of the layers will be magnified and impact the final product. Imperfections on the scale of a few nanometers can show up as printable defects on the finished mask and need to be reduced or eliminated from the surface of the mask blank before deposition of the multilayer stack. The thickness and uniformity of the deposited layers must meet very demanding specifications to not ruin the final completed mask.

Figure 2:
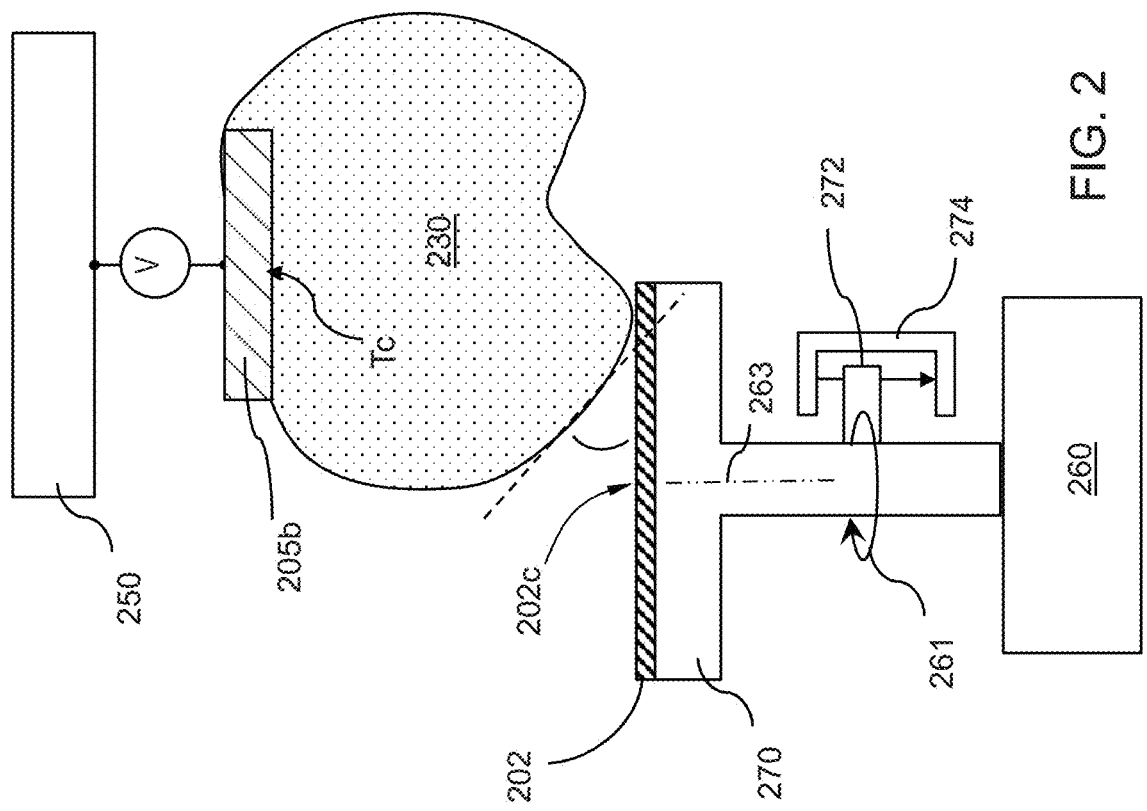
FIG. 2 is a schematic view of a portion of the PVD chamber shown in FIG. 1.

As shown in FIG. 2, a rotational motor 260 rotates substrate support 270 in the direction of arrow 261 during a PVD process. While rotation of the substrate support 270 reduces some non-uniformity of the material deposited during PVD, further improvements are needed for products that require demanding uniformity specifications such as EUV reflective elements.

In particular, for many devices that include Bragg reflectors such as EUV reflective elements and optical filters comprised of multilayers of different thin film materials, each layer should have extremely small non-uniformity. There is stringent requirement on uniformity of EUV reflective elements such as EUV reflective lenses and EUV mask blanks.

Considering the size of substrates that are used to manufacture EUV reflective elements, deposition multilayer stacks with small non-uniformity is extremely challenging. For example, EUV mask blanks are formed from large (e.g., typically greater than four-inch square or diameter). The fabrication tolerances for lithographic quality mask blanks require reflectivity uniformity in the range of ±0.1%, and centroid wavelength variation of a few tenths of an angstrom. The non-uniformity (NU) of a centroid wavelength (CWL) across the mask blank should be less than 0.04 nm.

As the CWL is proportional to the periodic thickness of the multilayer, each layer must have a NU well below 0.04 nm to meet specification of EUV mask. Some obstacles to meet CWL uniformity specifications for EUV mask blank for multilayer deposition in a MC PVD chamber are further discussed. An exemplary multilayer of EUV mask blank is a stack of alternating layers of Mo and Si with thickness as small as about 3 nm and about 4 nm respectively.

In a CVD chamber such as the type shown in FIG. 1 and having a rotating substrate support 270, the substrate support rotation cycle during deposition of multilayers of Mo or Si is typically less than 10 rotation for each layer deposited. It was determined that uniformity of each layer is very sensitive to substrate support rotation cycle. It was further determined that a non-full cycle rotation will cause unequal amount of deposition across the substrate surface in different areas, leading to high thickness non-uniformity and thus CWL non-uniformity. Furthermore, when the surface of substrate 2020 on the substrate support 270 is non-horizontal with respect to the PVD target surface during deposition, there will be more deposition on one side of the substrate 202 than the other. Thus, the non-horizontal effect deteriorates the overall uniformity of the deposited multilayer stack on the substrate.

According to a first embodiment, a method to quantitatively set substrate support rotation to achieve a full substrate support rotation cycle for each layer of the multilayer deposition has been found to improve deposition uniformity according to one or more embodiments. The full substrate support rotation results in equal material deposition from all angles of the substrate surface in a chamber where the target radial center and the substrate radial center are offset as shown in FIG. 1 and FIG. 2. This method enables deposition of a multilayer stack with very high uniformity. As used herein according to one or more embodiments, "full substrate support rotation" refers to the substrate report rotating a uniform number of times without any fractional or partial rotation beyond a full rotation of 360 degrees.

Stated another way, if a deposition cycle comprises a single rotation, the substrate support is rotated 360 degrees, and not less or greater than 360 degrees. Table 1 below provides the degrees of rotation for full substrate support rotations of deposition cycles comprising from one to 10 rotations:

TABLE 1

| Deposition Cycles | Degrees of Rotation |
| --- | --- |
| 1 | 360 +/− 0 |
| 2 | 720 +/− 0 |
| 3 | 1080 +/− 0 |
| 4 | 1440 +/− 0 |
| 5 | 1800 +/− 0 |
| 6 | 2160 +/− 0 |
| 7 | 2520 +/− 0 |
| 8 | 2880 +/− 0 |
| 9 | 3240 +/− 0 |
| 10 | 3600 +/− 0 |

In specific embodiments, EUV reflective elements can be manufactured having Mo/Si multilayer in thickness and in CWL over a qualified area of a substrate. IN an exemplary embodiment, each Mo layer deposition cycle requires a time of t seconds and a substrate support rotation of n full rotations. The substrate support rotation speed for Mo deposition should be set to n/t*60 rpm. The same can be applied to deposition of Si layer or other layers during the manufacture of an EUV reflective element.

An experiment was conducted in which alternating layers of molybdenum and silicon were deposited on an area of a substrate 132 mm×132 mm in a PVD chamber as shown in FIG. 1. In a first test that was not in accordance with the present disclosure, the deposition cycle occurred for each Mo and Si layer occurred during non-full rotations-6.3 rotations for the Mo deposition cycle and 9.6 rotations for the Si deposition cycle. In the first test, the periodic thickness of deposited multilayer at different substrate locations, was measured 49 times (7×7 points) over the substrate area of 132 mm×132 mm. The average thickness of the multilayer stack 13.516 nm, but the thickness varied in a range of 0.039 nm (maximum-minimum). The multilayers exhibited a thickness non-uniformity of 0.29%.

In a second test, alternating layers of molybdenum and silicon were deposited on an area of a substrate 132 mm×132 mm in a PVD chamber as shown in FIG. 1. The deposition cycle for each Mo and Si layer occurred during full rotations—exactly 6 rotations for the Mo deposition cycle and exactly 9 rotations for the Si deposition cycle. In the second test, the periodic thickness of deposited multilayer at different substrate locations, was measured 49 times (7×7 points) over the substrate area of 132 mm×132 mm. The average thickness of the multilayer stack 13.538 nm, but the thickness varied in a range of 0.025 nm (maximum-minimum). The multilayers exhibited a thickness non-uniformity of 0.18%. After full rotation cycle, the non-uniformity is reduced to 0.18%.

According to one or more embodiments, a substrate processing method comprises supporting a substrate on a rotating substrate support having a rotational axis and a rotation speed (v) to complete a whole number of rotations (n) in a process window time (t) and exposing the substrate to a physical vapor deposition process for the process window time (t) to form a first layer of material on the substrate. According to one or more embodiments, "a process window time (t)" refers to the time to complete process, such as deposition of a single layer of material. In one or more embodiments, the single layer of material has a predetermined thickness. In some embodiments, the process window time (t) refers to the time to deposit a single material layer A or the time to deposit a material layer B in a multilayer stack of A/B, for example where A is Mo and B is Si. A "whole number" refers to a positive integer. An integer does not include a fraction or a decimal point.

In one or more embodiments, the physical vapor deposition process utilizes a first cathode having a radial center that is offset from the rotational axis of the substrate support. The rotational axis of the substrate support is aligned with the radial center 202c (in FIG. 1 and FIG. 2) of the substrate. The method can further comprise determining a zeroing position on the rotating substrate support and starting the physical vapor deposition process immediately after the rotating substrate support is at the zeroing position. In one or more embodiments, the physical vapor deposition process is performed in a multi-cathode physical vapor deposition chamber having at least the first cathode and a second cathode having a radial center that is offset from the rotational axis of the substrate support. In one or more embodiments, the layer of material deposited on the substrate exhibits a thickness non-uniformity across a 132 mm×132 mm area of the substrate of less than 0.20%, less than 0.19%, less than 0.18%, less than 0.17%, less than 0.16%, less than 0.15% or less than 0.10%.

In another embodiment, the method further comprises depositing a second layer of material on the first layer of material to form a pair of layers comprising the first material and the second material, and forming an additional 39 pairs of layers of the first material and the second material. In one or more embodiments, the first layer comprises silicon and the second layer comprises molybdenum.

The methods described above can be executed by a non-transitory computer-readable storage medium including instructions, that, when executed by a processing unit of physical deposition chamber, causes the physical deposition chamber to perform the methods or operations described immediately above.

Figure 3:
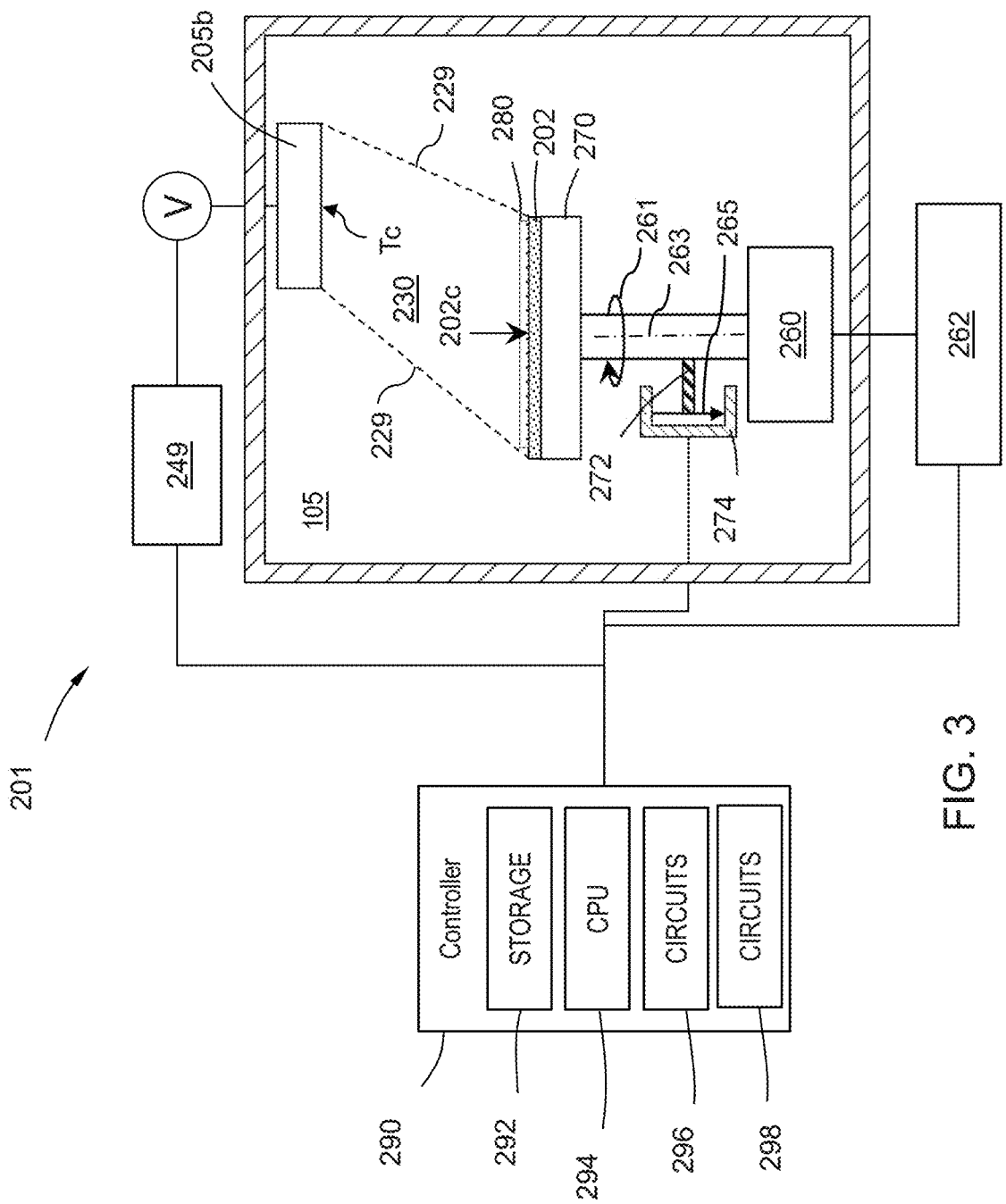
FIG. 3 is a schematic view of a portion of the PVD chamber shown in FIG. 1.
Figure 6:
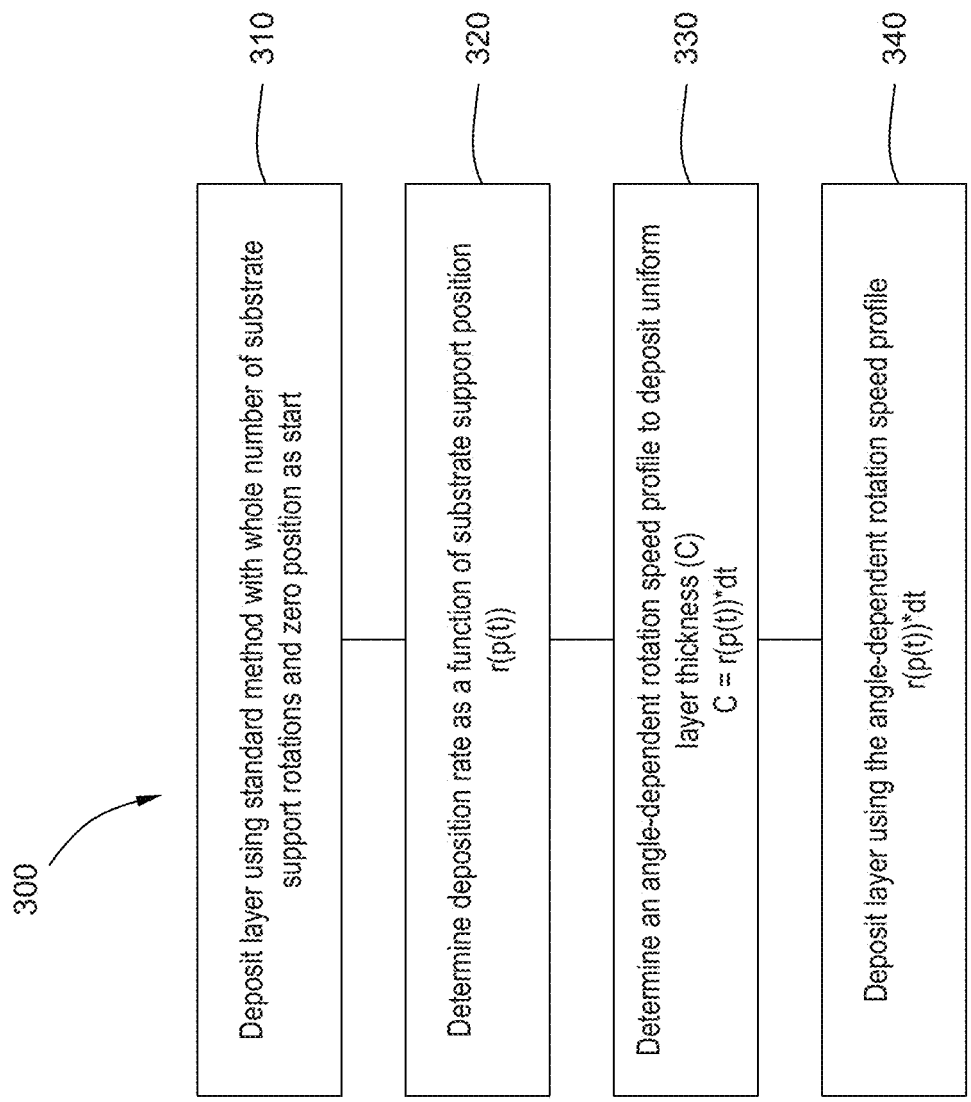
FIG. 6 illustrates steps of a method according to an embodiment of the disclosure.

A second aspect of the disclosure pertains to a physical vapor deposition chamber of the type shown in FIGS. 1 and 3. FIG. 3 is a schematic view of a portion of the PVD chamber 201 shown in FIG. providing details on the rotating substrate support 270 and the controller 290.

A physical vapor deposition chamber 201 comprises a rotating substrate support 270, rotated by a rotational motor 260 in communication with a motor driver 262 which rotates the substrate support around a rotational axis, a first cathode 205b having a radial center $T_c$ positioned off-center from a rotational axis 263 of the substrate support 270. The rotational axis 263 of the substrate support 270 is aligned with the radial center 202c of the substrate 202. The PVD chamber further comprises the process controller 290, which comprises one or more process configurations selected from a first configuration to determine a rotation speed (v) for a substrate support to complete a whole number of rotations (n) around the rotational axis of the substrate support in a process window time (t) to form a layer 280 of a first material on a substrate 202, or a second configuration to rotate the substrate support at the rotation speed (v).

In one or more embodiments, the PVD chamber further comprises at least the first target 205a and a second target 205b (shown in FIG. 1) having a radial center $T_c$ that is offset from the rotational axis 263 of the substrate support 270. In some embodiments, the physical vapor deposition chamber further comprises a zeroing flag 272 associated with the rotating substrate support 270, and a zeroing sensor 274 to detect the zeroing flag, wherein the controller 290 is configured to send a signal to apply power to the first cathode 205b when the zeroing sensor 274 detects the zeroing flag 272. The zeroing sensor 274 in one or more embodiments can be an infrared sensor.

Another aspect of the disclosure pertains to a non-transitory computer-readable storage medium including instructions, that, when executed by a processing unit of a processing system, cause the processing system to perform the operations of rotating a substrate 202 supported on a substrate support 270 having a rotational axis 263 at a rotation speed (v) to complete a whole number of rotations (n) in a process window time (t); applying power to a cathode 205b within the processing system, the cathode 205b having a radial center $T_c$ that is offset relative to the rotational axis 263 of the substrate support 270 to generate a plasma within the processing system for the process window time (t) to cause a material layer 280 to be deposited on the substrate 202.

According to one or more embodiments, implementation of a substrate support rotation profile p(t) into PVD chamber can include the following processes. First, an optimized substrate support rotation profile p(t) and desired total deposition time $t_0$ (s) of the process window (for example to determine a material layer 280 of a predetermined thickness are firstly input into the controller. Next, substrate support rotation is started with any setting initial speed (rpm) powered by the rotational motor 260. Then, the zeroing flag 272 is rotating together with the substrate support 270. A zeroing sensor 274 will locate the zeroing flag 272 and feedback the zero position of the substrate support to the controller.

Then, when the controller 290 receives the feedback zero signal from the zeroing sensor 274, substrate support 270 starts rotating based on an input from optimized substrate support profile p(t). Simultaneously, the controller 290 sends a signal to the power source 249 to be switched on to start deposition for the desired total deposition time $t_0$ (s).

Another aspect of the disclosure pertains to a substrate processing method, which comprises placing a substrate 202 on a substrate support 270, rotating the substrate support around a rotational axis 263 at a dynamic rotation speed profile in a physical vapor deposition chamber 201, the dynamic rotation speed profile varying with rotation (angular) position 265 of the substrate support 270 relative to the rotational axis 263, and depositing a material layer 280 by physical vapor deposition while rotating the substrate support 270. In some embodiments, the dynamic rotation speed profile compensates for deposition non-uniformity on the substrate. In some embodiments, the method comprises compiling the dynamic rotation speed profile as a function of rotation position 265 relative to the rotational axis 263 of the substrate support 270.

In some embodiments, the dynamic rotation speed profile comprises angle-dependent rotation speeds for the substrate support 270. In some embodiments, the method further comprises rotating the substrate support 270 around the rotational axis 263 at the dynamic rotation speed profile to complete a whole number of rotations (n) in a process window time (t) to deposit the material layer 280 on the substrate 202.

In another embodiment, a physical vapor deposition chamber shown with respect to FIG. 1 and FIG. 3 comprises a rotatable substrate support 270, a cathode and the physical vapor deposition process controller 290 comprising one or more process configurations selected from a first configuration to rotate a substrate support 270 within the physical vapor deposition chamber 201 at a dynamic rotation speed profile, or a second configuration to power a cathode within the processing chamber.

In some embodiments, the dynamic rotation speed profile compensates for deposition non-uniformity on the substrate. In some embodiments, the physical vapor deposition chamber further comprises a zeroing flag 272 to calibrate the rotation angle 265 of the substrate support 270.

Another embodiment pertains to a non-transitory computer-readable storage medium including instructions, that, when executed by a processing unit of physical deposition chamber, causes the physical deposition chamber to perform the operations of rotating a substrate support within the physical deposition chamber at a dynamic rotation speed profile, the dynamic rotation speed profile comprising a plurality of angle-dependent rotation speeds; and applying power to cathode within the processing system to generate a plasma within the processing system for a process window time (t) to form a first layer 280 of material on the substrate 202.

According to one or more embodiments, the methods, PVD chamber 201 and controller described herein provide for precise control of starting substrate support position further enables full control of substrate support position during the whole deposition period as described above. What is referred to as the non-horizontal effect deteriorates deposition uniformity, even though achieving full-cycle substrate support rotation and controlling the starting position for deposition.

Therefore, according to one or more embodiments, methods of full position control p(t) (p(t) is the position of the substrate support as function of time t) for rotation of the substrate support provided to compensate the non-horizontal effect for improved deposition uniformity of a material layer on a substrate in a PVD chamber, where $0 \leq p(t) < 1$ is the cycle fraction of the substrate support with respect to the zero position.

Referring now to FIGS. 4A-B, 5 and 6, a substrate support rotation profile for substrate support rotation control described herein is provided by the following method 300. First, in step 310 of FIG. 6 a layer 280 of material is deposited on a substrate 202 using the PVD method described herein with full-cycle substrate support rotation (i.e., rotating the substrate a whole number of times for each deposition cycle) and controlled substrate support zero position as the starting position of the substrate support as described herein using the zeroing flag. In step 320, deposition rate r(p(t)) as a function of substrate support position p(t) can be obtained from empirical measurements of the thickness of the material layer 280 over a plurality of positions on the wafer/substrate. For example, for a mask blank substrate having an area of 132 mm×132 mm, thickness measurements can be taken in a matrix of 7×7 for a total of 49 positions equally spaced across the area of the substrate. The present disclosure is not limited to any particular number of positions from which thickness measurements are taken. The thickness can be measured by a variety of techniques capable of measuring the thickness of a material layer on a substrate, for example, by opto-acoustic measurement, X-ray reflectivity measurement, transmission electron microscopy, ellipsometry spectroscopy or a reflectometer.

After obtaining the empirical thickness measurements at a plurality of locations, next, in step 330 for ideal uniformity, r(p(t))*dt should remain unchanged across the entire substrate, and hence r(p(t))*dt=C, where C is a constant and independent of time t. The parameter dt (derivative t) is an infinitely small time interval at time t. Thus, r(p(t))*dt is the total material being deposited on the substrate at a discrete substrate support position as a function of time, p(t). Based on the experimental function r(p(t)) and the relationship r(p(t))*dt=C, an optimized substrate support rotation profile p(t) as a function of time t can be obtained to adjust for ideal material layer uniformity. In step 340, the optimized substrate support rotation profile p(t) can be implemented in a method and input into a PVD controller with a control feedback loop for film deposition with optimized uniformity without non-horizontal effect such that a layer is deposited using the angle-dependent rotation speed profile as a function of position to deposit a layer having uniform thickness.

FIGS. 4A-B together with FIG. 5 provide an illustration of the method. In FIG. 4A, angular position is plotted versus thickness which is obtained from step 330, and in FIG. 4B, rotation angle versus target rotation speed is plotted. As can be seen from FIG. 4B, the rotation speed is varied as a function of rotation angle. FIG. 5 shows a substrate 202 having a reference position 285 referenced to the underlying substrate support 270, and rotation vector 287 indicates rotation of the substrate 202. The substrate 202 is rotated from zero degrees, to 90 degrees, to 180 degrees to 270 degrees and to 360 degrees. The angle-dependent rotation speed profile can be determined as shown in step 330, and this information can be used to deposit a layer using the angle-dependent rotation speed profile as shown in step 340. The dynamic rotation speed profile compensates for deposition non-uniformity on the substrate.

In a specific embodiment of the disclosure, implementation of optimized substrate support rotation profile p(t) into PVD chamber with a controller includes the following processes. First, an optimized substrate support rotation profile p(t) and desired total deposition time $t_0$ (s) are input into the controller. Then, the substrate support rotation is started with any setting initial speed (rpm) powered by the rotational motor. A zeroing flag rotates together with the substrate support. A zeroing sensor will locate the zeroing flag and feedback the zero position of the substrate support to the controller. When the controller receives the feedback zero signal from the zeroing sensor, the substrate support starts rotating based on the input optimized substrate support profile p(t). Simultaneously, power source is switched on to apply power to a cathode start deposition for the desired total deposition time $t_0$ (s).

Thus, according to one or more embodiments, a method and system to control substrate support rotation to improve film uniformity for applications in Bragg reflector based optical filters and EUV mask blank is provided. According to specific embodiments, problems caused by arbitrary non-full cycle substrate support rotation are eliminated, and in some embodiments, the non-horizontal effect is addressed. A quantitative method of controlling substrate support rotation for full-cycle substrate support rotation to improve deposition uniformity is provided. Also provided is a controller with a feedback loop to precisely control the starting position for substrate support rotation to improve deposition uniformity In addition, a controller with implementation of substrate support rotation profile to eliminate non-horizontal effect and improve deposition uniformity is provided. The dynamic rotation speed profile compensates for deposition non-uniformity that stills remains after whole-cycle rotation due to various reasons, such as non-horizontal effect, plume profile/shape, back scattering effect or other process conditions, etc.

The controller 290 of the PVD chamber 201 can be used to control any of the processes described herein. The controller 290 can send control signals to activate a DC, RF or pulsed DC power source, and control the power applied to the respective targets during deposition. Furthermore, the controller can send control signals to adjust the gas pressure in the PVD chamber 201. The controller 290 can also be used to control rotation of the upper shield 213 during each of the processes described above.

Referring now to FIGS. 7-13, further embodiments of the disclosure pertain to physical vapor deposition chambers and physical vapor deposition methods that address radial non-uniformity in thickness, which is determined by the relative orientation between plume area 230 and the substrate 202 (or wafer), which, according to some embodiments, cannot be fully addressed by rotation of the substrate 202. Even when the substrate is rotated during a PVD process, according to some embodiments, the deposition rate at point the center of the substrate is lower than at the edge of the substrate.

According to one or more embodiments of the disclosure, the relative orientation between substrate surface 202a and edge of the plume area 230 are tuned to improve film uniformity by tilting the substrate 202 and/or tilting the target 205b and/or entire cathode assembly 211b. While FIGS. 7-13 show only target assembly 205b or cathode assembly 211b tilted, it will be understood that all or any of the targets and/or cathode assemblies of a multi-cathode chamber are tilted in accordance with one or more embodiments of the disclosure.

Figure 7:
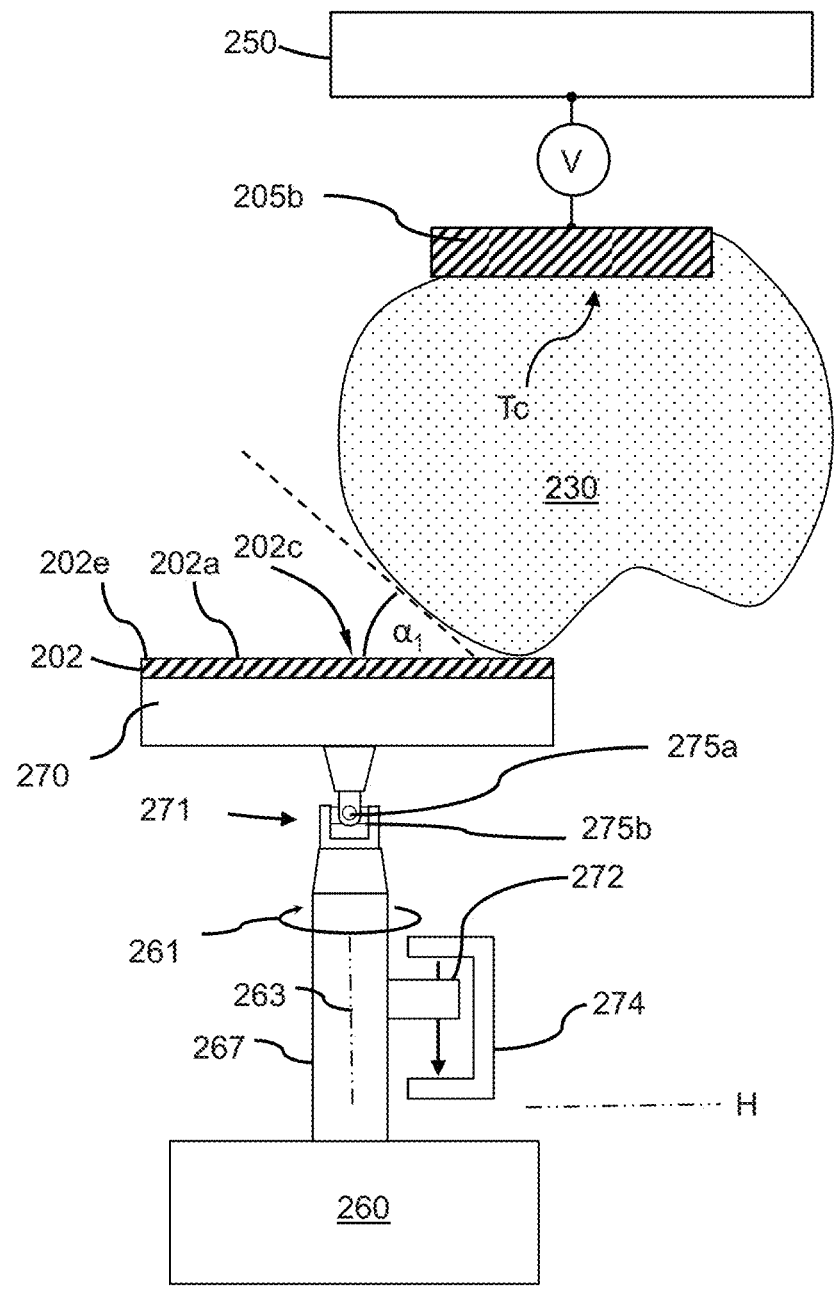
FIG. 7 is a schematic view of a portion of the PVD chamber having a tilting target in a first angular position.
Figure 8:
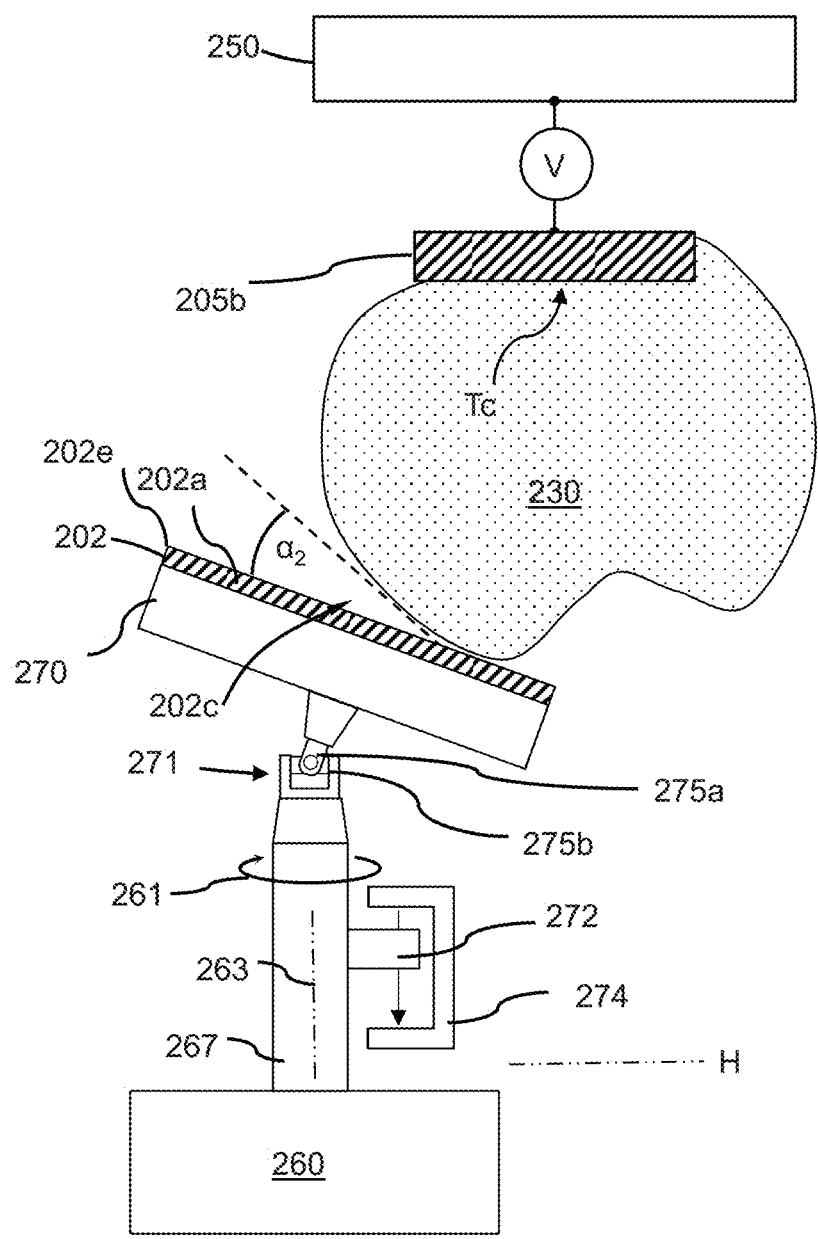
FIG. 8 is a schematic view of the portion of the PVD shown in FIG. 7 with the tilting target in a second angular position.
Figure 9:
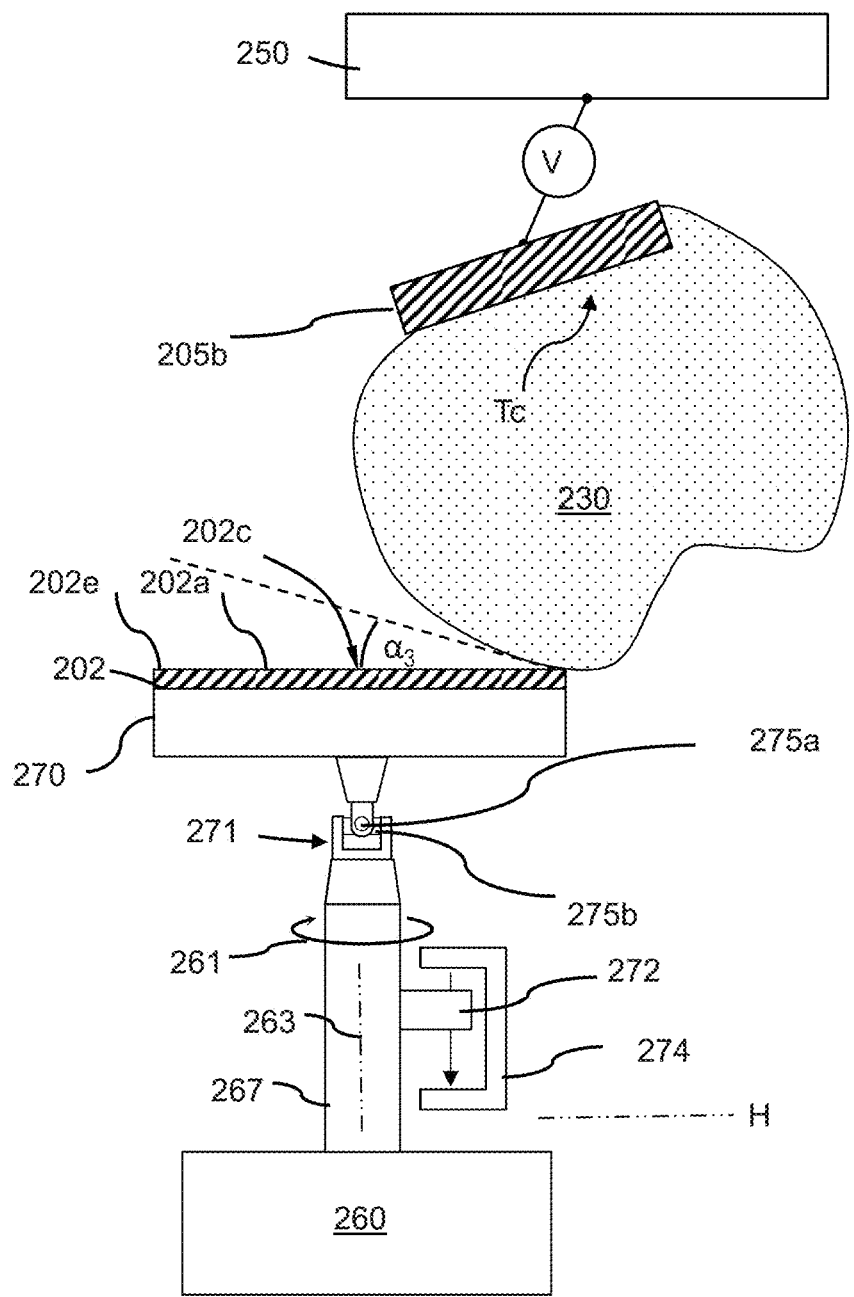
FIG. 9 is a schematic view of the portion of the PVD shown in FIG. 7 with the tilting target in a third angular position.
Figure 10:
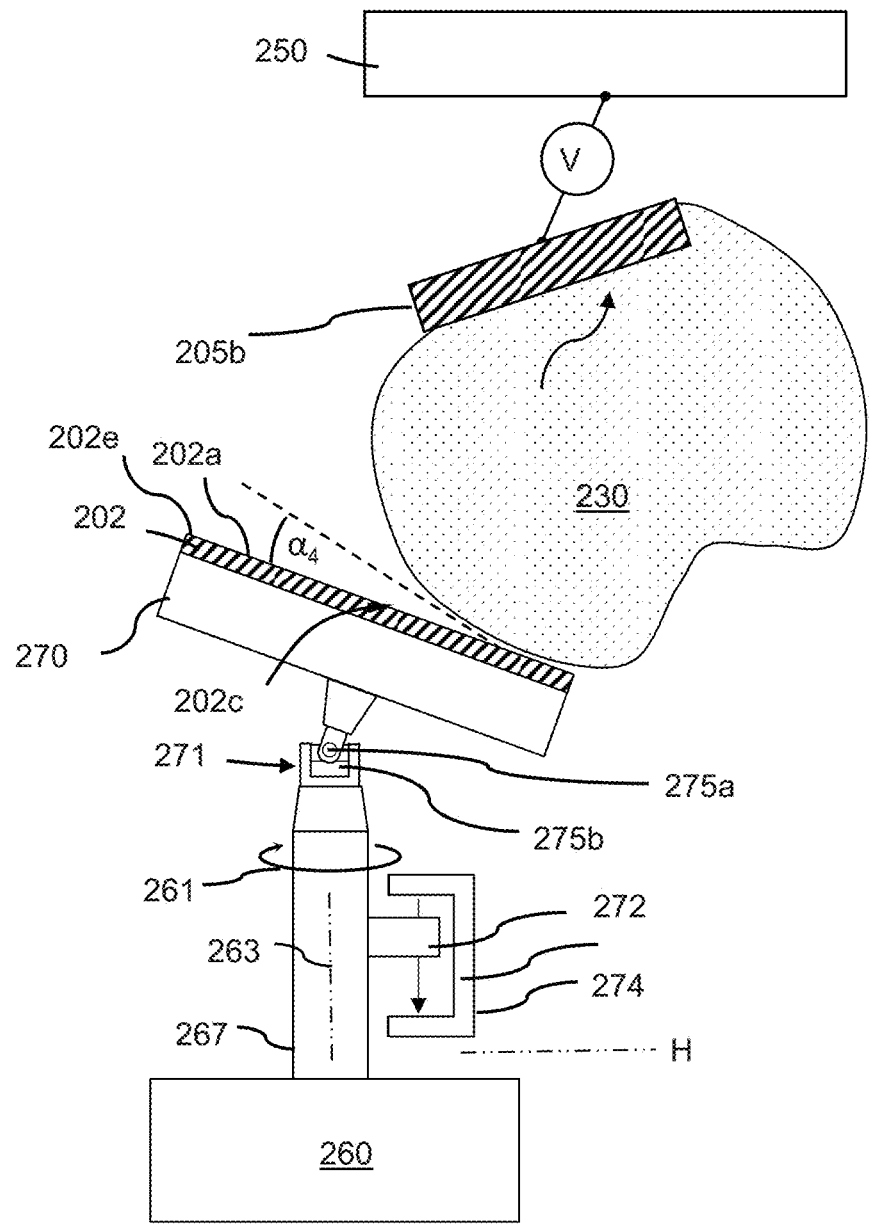
FIG. 10 is a schematic view of the portion of the PVD shown in FIG. 7 with the tilting target in a fourth angular position.

FIGS. 7-10 show the substrate support 270 in a tilted configuration so that the angle $\alpha_1$ between the edge of the plume area 230 and the substrate surface 202a is varied. In FIG. 7, the substrate support 270 and the target 205b are in a substantially horizontal position so that angle $\alpha_1$ between the substrate surface 202a and edge of the plume area 230 is relatively large, for example in a range of from 45 degrees to 75 degrees. In FIG. 8, the substrate support 270 is tilted while the target 205b is in a horizontal position so that the angle $\alpha_2$ between the substrate surface 202a and edge of the plume area 230 is less than the angle $\alpha_1$ in FIG. 7. For example, in FIG. 8, $\alpha_2$ can be in a range of 10 degrees and 45 degrees. In FIG. 9, the substrate support 270 is at a substantially horizontal position but the target 205b is tilted at and angle so that angle $\alpha_3$ is greater than angle $\alpha_1$ in FIG. 7. In FIG. 10, the substrate support 270 is tilted and the target 205b is tilted so that angle $\alpha_4$ is less than angle $\alpha_1$. For example, angle $\alpha_4$ is in a range of from 10 degrees and 30 degrees.

The configuration of tilt angles shown in FIGS. 7-10 is exemplary only, and other embodiments are possible. In FIG. 7, the larger angle $\alpha_1$ and a plume area 230 that is irregularly shaped could result in the deposition of material on the substrate surface 202a is non-uniform. Tilting of the substrate support 270 to decrease the angle to $\alpha_2$ as shown in FIG. 8, or tilting of the target 202b as shown in FIG. 8 to decrease the angle to $\alpha_3$ or tilting both the substrate support 270 and the target 202b to decrease the angle to $\alpha_4$ result in improved uniformity of deposition of the material layer across the entire surface of the substrate from the center 202c to the edge 202e of the substrate 202.

Figure 13:
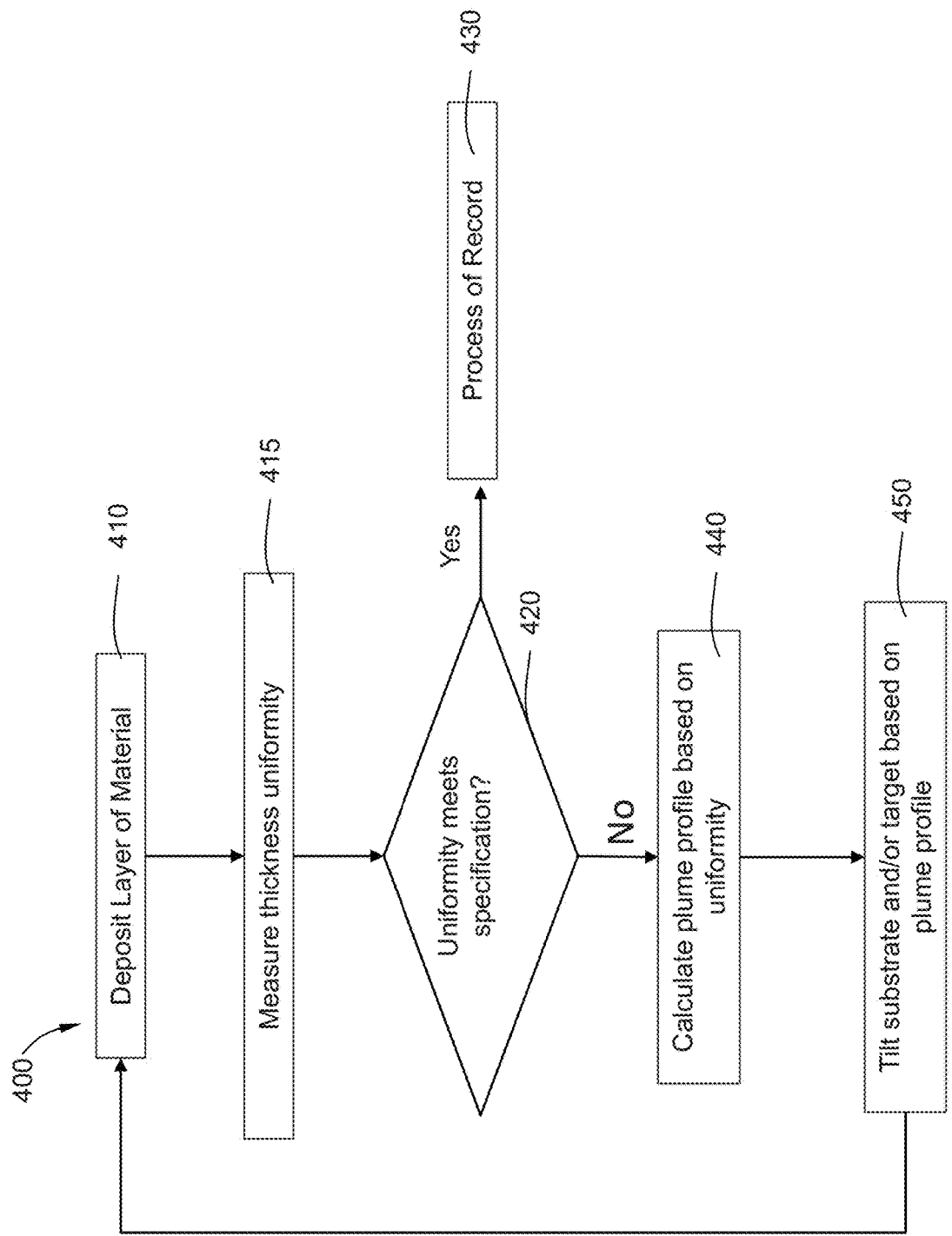
FIG. 13 is an illustration of a method according to an embodiment of the disclosure.

Referring now to FIG. 13, in one or more embodiments, a method 401 is provided of depositing a layer of material on a substrate. In a first embodiment, a physical vapor deposition method includes a step 410 in which a layer of material is deposited. Thickness uniformity is measured in step 415 from the substrate center 202c to substrate edge 202e. The thickness can be measured by a variety of techniques or apparatus capable of measuring the thickness of a material layer on a substrate, for example, by opto-acoustic measurement, X-ray reflectivity measurement, transmission electron microscopy, ellipsometry spectroscopy or a reflectometer.

Figure 12:
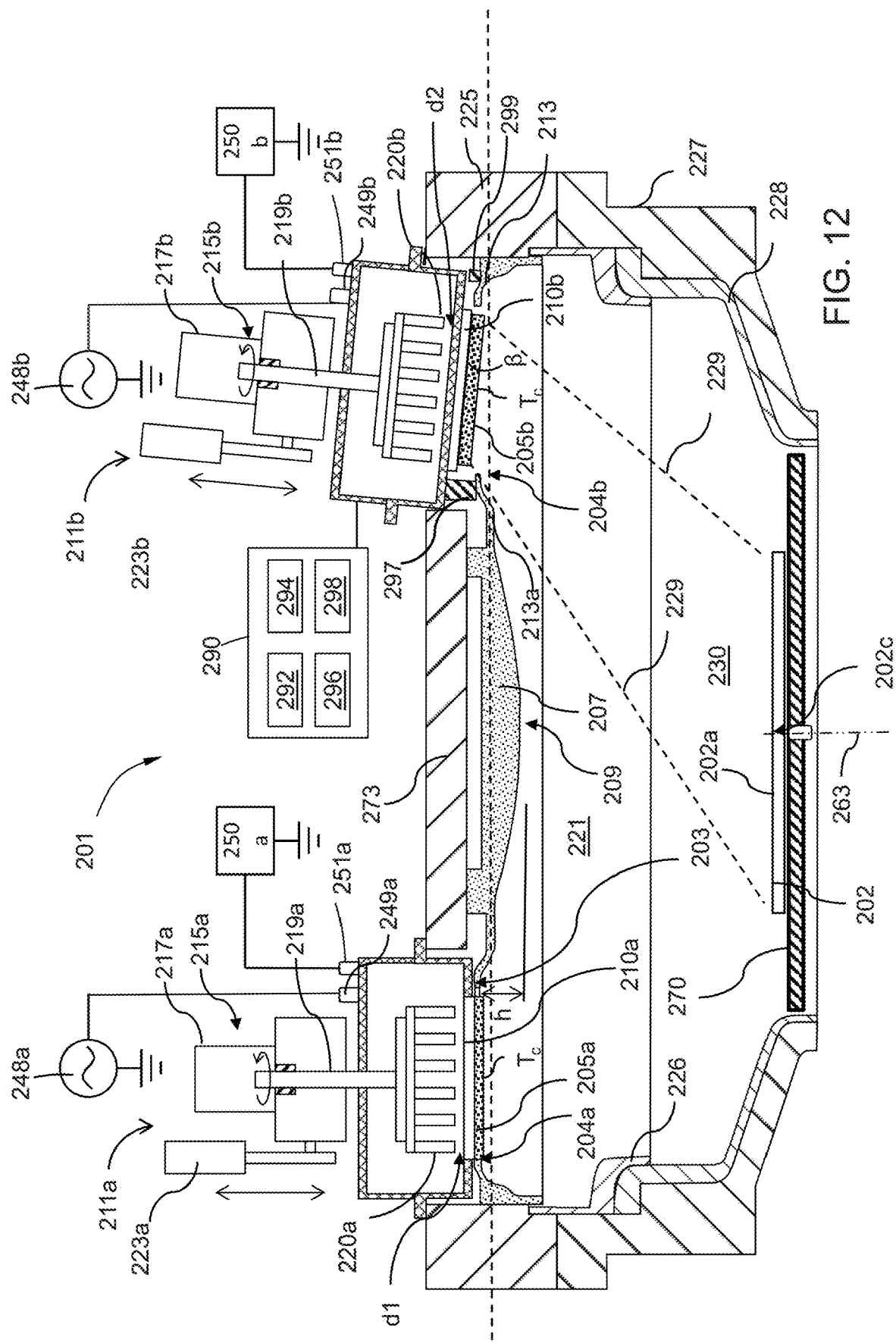
FIG. 12 is a side view of another embodiment of a PVD chamber including a tilting cathode assembly and the edge shaped ring adapter shown in FIG. 11.

In step 420, the thickness uniformity across the substrate from the substrate center 202c to the substrate edge 202e is compared against a predetermined thickness uniformity specification. A thickness uniformity specification, for example, an acceptable thickness variation of less than a predetermined percentage such as 0.005%, 0.05%, 0.1%, 0.2%, 0.3%, and the like, or a predetermined maximum variation of thickness value such as 1000 nm, 500 nm, 100 nm, 90 nm, 80 nm, 70 nm, 60 nm, 50 nm, 40, nm, 10 nm 5 nm, 1 nm, 0.5 nm or 0.1 nm. These variations in percentage or thickness values can be stored in a memory 294 as part of a controller 290, which can comprise a processor 292, the memory 294 coupled to the processor 292, input/output devices coupled to the processor 292, and support circuits 296 and 298 to provide communication between the different electronic components in a chamber as shown in FIG. 12. The controller 290 can be part of a chamber that includes a substrate support 270 that is configured to be tilted, and in some embodiments, a substrate support 270 that is configured to be tilted and a target 202b and/or cathode assembly 211b that is configured to be tilted, as shown in FIGS. 7-10. The acceptable thickness variation percentages and maximum variation of thickness values are stored in the memory 294 in a lookup table, and during the method 401, the processor 292 can compare the measured value with the lookup table.

In step 420, if the thickness uniformity variation in percentage or maximum variation in thickness is within specifications, the process stops at step 430 and the process of record is recorded in the memory 294. If it is determined that the thickness uniformity variation in percentage or maximum variation in thickness is not within specification the plume area 230 profile is evaluated and calculated based on the thickness uniformity in step 440. Empirical data stored in the memory 294 based on previous process runs then calculate the angle at which the substrate support 270 and/or the target 202b should be tilted to improve the uniformity within the specification at step 440. In step 450, one or both of the substrate support 270 and target 202b are tilted to change the angle between the plume area 230 and the substrate surface 202c until the uniformity meets specification. The steps 410 and 415 (and, if necessary, 440 and 450) are repeated until the thickness uniformity meets the specification in step 420 and the process is terminated at step 430. The controller 290 can send a signal to change the tilt angle of the substrate support 270 and/or the target 202b.

Referring back to FIGS. 7-10, the substrate support 270 is configured to be tilted at an angle with respect to a horizontal plane H or so that the substrate support is tilted at an angle with respect to the rotational axis 263 so that the substrate support 270 and the substrate 2202 are at an angle that is not 90 degrees with respect to the rotational axis 263. In one or more embodiments a pivot is provided between the substrate support 270 and a rotational shaft 267 coupled to a motor 260 configured to rotate the rotational shaft 267 and the substrate support 20. The substrate support can comprises a universal joint 271 that includes a first pivot 275a orthogonal to a second pivot 275b that allows the substrate support 270 to be tilted at an angle with respect to the horizontal plane while maintaining the rotational axis 263 normal to a horizontal plane H.

Figure 11A:
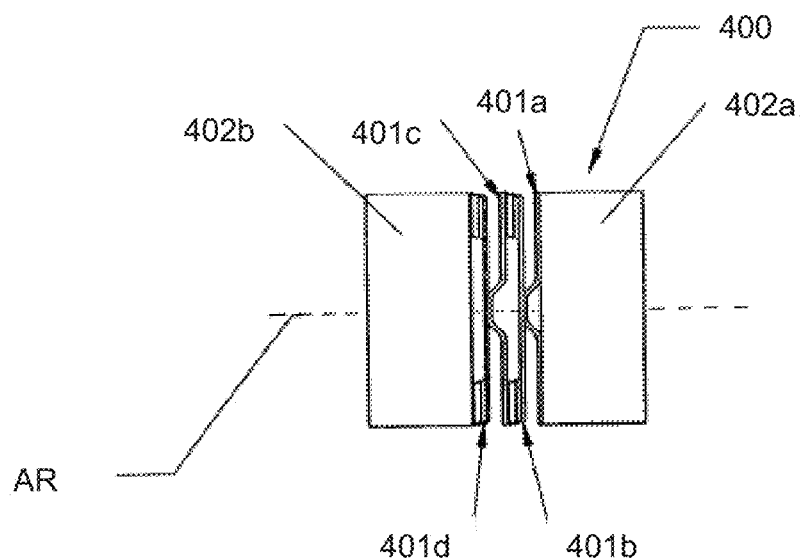
FIG. 11A is a perspective view of a coupling according to an embodiment of the disclosure.

In other embodiments, the substrate support comprises a flexible bellow coupling 400 shown in FIG. 11A, which transmits rotational force from rotational axis 263 to tilt the substrate support 270 with respect to the rotational axis 263. In one or more embodiments, the flexible bellow coupling 400 can be used in place of the universal joint 271. The flexible bellow coupling 400 provides a pivot between the rotational shaft 267 and thee substrate support 270. The flexible bellow coupling 400 comprises a plurality of longitudinally (axially) spaced disks, between a first end member 402a and second end member 402b. The flexible coupling 400 shown in FIG. 11A includes four circular disks 401a, 401b, 401c, and 401d (collectively referred to as disks), longitudinally spaced by axially aligned formed spacer portions not shown (collectively referred to as formed spacer portions). The disks 401a, 401b, 401c, 401d are longitudinally spaced by the formed spacer portions between the first and second end members 402a and 402b and all components share a common axis of revolution AR, shown extending through the length of flexible bellow coupling 400. First and second end members 402a and 402b, which may have a different diameter than the disks, serve as hubs configured to coaxially connect each of the first and second end members 402a and 402b to a driving end (e.g., the motor 260 in FIGS. 7-10) and driven end (e.g., the substrate support 270) respectively which are to be joined by the flexible bellow coupling 402b. Such a flexible bellow coupling is available from C-flex Bearing Co., Inc, https://c-flex.com/. The flexible bellow coupling thus provides a pivot between the substrate support and the rotational shaft 267 and is configured to tilt the substrate support with respect to the horizontal axis H.

The universal joint 271 and the flexible bellows coupling 400 provide substrate support that is configured to tilt the substrate support 270 with respect to the horizontal plane H at an angle that is not 90 degrees with respect to the rotational axis 263 of the substrate support. Thus, in one or more embodiments, the PVD chamber comprises a coupling including a pivot that is configured to tilt the substrate support. In use a layer thickness measurement system measures thickness of the layer on the substrate from the edge of the substrate to the center of the substrate. A controller such as controller 290 can then adjust the angle of the substrate support with respect to the target by tilting the substrate support to compensate for thickness non-uniformities measured by the layer thickness measurement system. The thickness measurement system can comprise an opto-acoustic measurement system, an X-ray reflectivity measurement system, a transmission electron microscopy measurement system, and ellipsometry spectroscopy measurement system or a reflectometer measurement system. The controller 290 can utilize feedback loop in which measurements from the measurement system are used to determine the degree to which the substrate support is tilted during a PVD process to compensate for deposition non-uniformity across a substrate from the substrate edge to the substrate center.

Figure 11B:
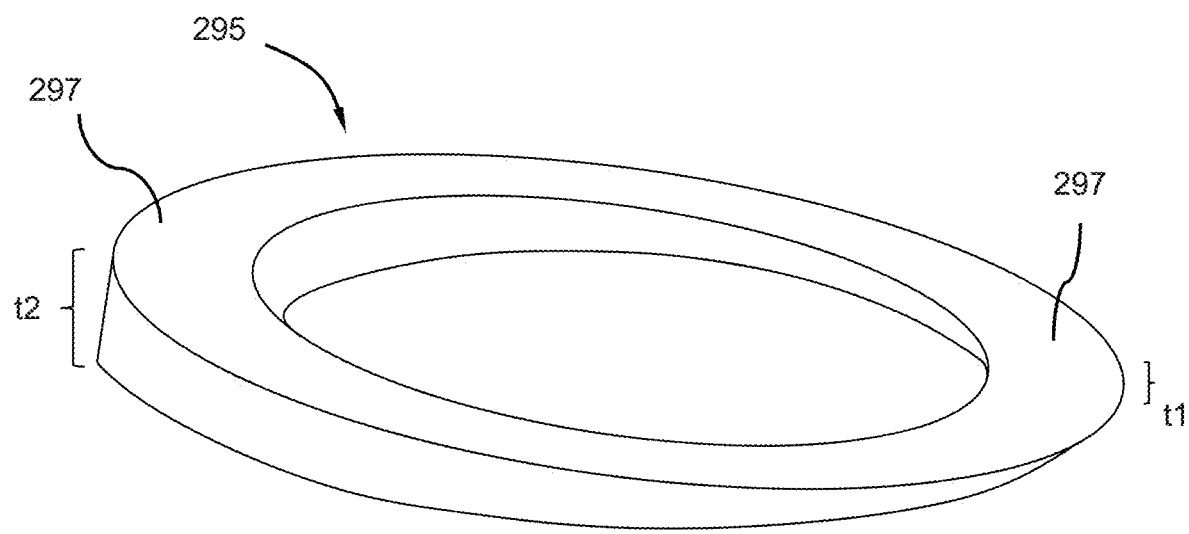
FIG. 11B is a perspective view of a wedge-shaped ring adapter according to an embodiment of the disclosure.

Referring now to FIG. 11B and FIG. 12 the chamber shown and described above with respect to FIG. 1 further comprises a cathode assembly 211b that is configured to be tilted with respect to the horizontal plane H and the substrate surface 202a. In one or more embodiments, the cathode assembly 211b is configured to be tilted with a ring adapter 295, which has a thickness t1 on one side 297 that is less than a thickness t2 on a second side 297 of the ring adapter so that the ring adapter is a wedge-shaped ring adapter 295. As shown in FIG. 12, when placed between the cathode assembly 221b and the upper shield 213, the ring adapter 295 causes the target 205 to be tilted at an angle β with respect to the horizontal plane H. According to one or more embodiments, each of a plurality of target assemblies in a multi-cathode chamber can have different ring adapters to provide different angles of the respective target with respect to the horizontal axis H. For example, in a multi-cathode PVD chamber a first target 20 tilted at a first angle $β_1$ with respect to the horizontal plane, and a second target 205b tilted at a second angle $β_2$ with respect to the horizontal plane, where $β_2$ is greater than $β_1$. Likewise, a third target 205c is tilted at a third angle $β_3$ with respect to the horizontal plane, where $β_3$ is greater than $β_2$, and a fourth target 205d is tilted at a fourth angle $β_4$ with respect to the horizontal plane, where $β_4$ is greater than $β_3$. A multi-cathode chamber in which four or more targets are arranged at different angles $β_1$, $β_2$, $β_3$, and $β_4$ and where none of $β_1$, $β_2$, $β_3$, and $β_4$ are equal with respect to the horizontal plane is configured to provide angular adjustment of the target with respect to the substrate 202 during a PVD process.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A physical vapor deposition chamber comprising:
a first cathode assembly including a first magnet and a first target comprising material to be deposited on a substrate when power is applied to the first cathode assembly and configured to produce a plume area of material from the first target during a physical vapor deposition process and to form a layer of material on across a surface of the substrate;
a motor coupled to a rotational shaft having a rotational axis;
a zeroing flag coupled to the rotational shaft and a zeroing sensor to detect the zeroing flag;
a substrate support coupled to the rotational shaft by a coupling comprising a pivot, the coupling configured to move the substrate support from a position that is parallel to a horizontal axis and tilted at a tilt angle from the horizontal axis; and
a controller configured to control the physical vapor deposition process to send a signal to apply the power to the first cathode assembly when the zeroing sensor detects the zeroing flag and to control and change the tilt angle of the substrate support to improve thickness uniformity of the layer of material across the surface of the substrate, wherein the controller is coupled to a measurement system, and measurements from the measurement system are used to determine a degree to which the substrate support is tilted to compensate for deposition non-uniformity across the substrate from a substrate edge to a substrate center.

2. The physical vapor deposition chamber of claim 1, further comprising a second cathode assembly comprising a second target the first target and the second target each having a radial center that is offset from a center of the substrate.

3. The physical vapor deposition chamber of claim 2, wherein the coupling comprises a universal joint and a first pivot and a second pivot.

4. The physical vapor deposition chamber of claim 2, wherein the coupling comprises a flexible bellows coupling.

5. The physical vapor deposition chamber of claim 2, wherein the first target is tilted with respect to the horizontal axis.

6. The physical vapor deposition chamber of claim 5, further comprising a first ring adapter supporting the first cathode assembly, the first ring adapter having a thickness that is different on a first side of the first ring adapter than a second side of the first ring adapter.

7. The physical vapor deposition chamber of claim 6, wherein the first ring adapter is wedge shaped.

8. The physical vapor deposition chamber of claim 6, further comprising a second ring adapter supporting the second cathode assembly.

9. The physical vapor deposition chamber of claim 8, wherein the first target and the second target are disposed at different angles with respect to the horizontal axis.

10. A non-transitory computer-readable storage medium including instructions, that, when executed by a processing unit of the physical deposition chamber of claim 1, causes the physical deposition chamber to perform operations of:
rotating the substrate support within the physical deposition chamber;
tilting the substrate support to change the tilt angle with respect to the horizontal axis; and
applying the power to the first cathode assembly to generate a plasma within the physical vapor deposition chamber to form the layer of material on the substrate.

* * * * *